United States Patent
Sasaki

(10) Patent No.: US 10,109,335 B2
(45) Date of Patent: Oct. 23, 2018

(54) APPARATUS AND METHOD FOR CONTROLLING WRITE CURRENT OF MAGNETIC MEMORY BASED ON TEMPERATURE DEPENDENT COERCIVE FORCE

(71) Applicant: TDK CORPORATION, Tokyo (JP)

(72) Inventor: Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/421,117

(22) Filed: Jan. 31, 2017

(65) Prior Publication Data

US 2017/0229163 A1    Aug. 10, 2017

(30) Foreign Application Priority Data

Feb. 5, 2016    (JP) .................. 2016-020598

(51) Int. Cl.
| | |
|---|---|
| *G11C 11/16* | (2006.01) |
| *H01L 43/08* | (2006.01) |
| *H01L 27/22* | (2006.01) |
| *H01L 43/02* | (2006.01) |
| *G11C 7/04* | (2006.01) |
| *H01L 49/02* | (2006.01) |

(52) U.S. Cl.
CPC ............ *G11C 11/1695* (2013.01); *G11C 7/04* (2013.01); *G11C 11/161* (2013.01); *G11C 11/1675* (2013.01); *H01L 27/222* (2013.01); *H01L 28/00* (2013.01); *H01L 43/02* (2013.01); *H01L 43/08* (2013.01)

(58) Field of Classification Search
CPC .................... G11C 11/1695; G11C 11/161
See application file for complete search history.

(56) References Cited

U.S. PATENT DOCUMENTS

| | | | | |
|---|---|---|---|---|
| 5,389,889 | A | * | 2/1995 | Towne .................. G01R 33/07 327/511 |
| 5,880,911 | A | * | 3/1999 | Ishihara ................. B82Y 10/00 257/E43.004 |
| 5,940,319 | A | * | 8/1999 | Durlam ................. B82Y 10/00 257/E21.665 |

(Continued)

FOREIGN PATENT DOCUMENTS

| | | |
|---|---|---|
| EP | 0844679 A1 * 5/1998 | ............... G11B 5/48 |
| JP | 2004-095157 A    3/2004 | |

(Continued)

OTHER PUBLICATIONS

Adachi., Magnetism of Copunds—Itineront Electron System, Solid-State Sciences Library, pp. 218-219, 1996.

(Continued)

*Primary Examiner* — Anthan Tran
*Assistant Examiner* — Mushfique Siddique
(74) *Attorney, Agent, or Firm* — Oliff PLC

(57) ABSTRACT

A magnetic memory includes: a magnetoresistance element; a conductive portion that is laminated on the magnetoresistance element; and a control portion configured to determine a driving temperature of the magnetoresistance element based on a change in a resistance value of the conductive portion and to control the amount of current applied to the magnetoresistance element.

7 Claims, 4 Drawing Sheets

(56) References Cited

U.S. PATENT DOCUMENTS

| | | | | |
|---|---|---|---|---|
| 6,077,618 | A * | 6/2000 | Sakakima | G11B 5/48 257/E43.004 |
| 6,385,082 | B1 * | 5/2002 | Abraham | G11C 11/15 365/145 |
| 6,442,064 | B1 * | 8/2002 | Michijima | B82Y 10/00 257/E21.665 |
| 6,476,716 | B1 * | 11/2002 | Ledlow | G05B 15/02 340/3.1 |
| 6,538,297 | B2 * | 3/2003 | Odagawa | G11C 11/16 257/25 |
| 6,603,677 | B2 * | 8/2003 | Redon | B82Y 10/00 257/E21.665 |
| 6,608,790 | B2 * | 8/2003 | Tran | G11C 11/16 365/211 |
| 6,611,455 | B2 * | 8/2003 | Sekiguchi | G11C 11/16 365/158 |
| 6,834,010 | B1 * | 12/2004 | Qi | G11C 11/16 365/185.05 |
| 7,035,137 | B2 * | 4/2006 | Iwata | G11C 11/15 365/158 |
| 7,079,438 | B2 * | 7/2006 | Perner | G11C 11/1675 365/210.1 |
| 7,145,824 | B2 * | 12/2006 | Bill | B82Y 10/00 365/212 |
| 7,230,308 | B2 * | 6/2007 | Iwata | B82Y 10/00 257/295 |
| 7,277,262 | B2 * | 10/2007 | Takagishi | G11B 5/3912 360/324.1 |
| 7,277,343 | B1 * | 10/2007 | So | G11C 5/147 365/189.07 |
| 7,510,883 | B2 * | 3/2009 | Chung | G01K 7/36 257/414 |
| 7,593,278 | B2 * | 9/2009 | Hu | G11C 11/16 365/158 |
| 7,649,377 | B2 * | 1/2010 | Ko | G01R 31/2875 324/750.03 |
| 8,279,661 | B2 * | 10/2012 | Ogimoto | G11C 11/16 365/158 |
| 8,709,617 | B2 * | 4/2014 | Ogimoto | B82Y 25/00 257/421 |
| 8,947,907 | B1 * | 2/2015 | Hollmer | G11C 7/04 365/148 |
| 9,605,979 | B2 * | 3/2017 | Eagen | G01R 33/0082 |
| 2001/0021124 | A1 * | 9/2001 | Odagawa | G11C 11/16 365/158 |
| 2002/0114092 | A1 * | 8/2002 | Yang | G11B 33/144 360/31 |
| 2003/0081467 | A1 * | 5/2003 | Nishimura | B82Y 25/00 365/200 |
| 2003/0103401 | A1 * | 6/2003 | Tran | G11C 11/16 365/211 |
| 2003/0103402 | A1 * | 6/2003 | Tran | G11C 11/16 365/211 |
| 2004/0008557 | A1 * | 1/2004 | Perner | G11C 7/04 365/211 |
| 2004/0027733 | A1 * | 2/2004 | Matsukawa | B82Y 10/00 360/324.2 |
| 2004/0042262 | A1 * | 3/2004 | Tran | G11C 11/15 365/158 |
| 2004/0252551 | A1 | 12/2004 | Iwata et al. | |
| 2005/0018478 | A1 * | 1/2005 | Nagase | G11C 11/16 365/171 |
| 2005/0254294 | A1 | 11/2005 | Iwata | |
| 2006/0014346 | A1 * | 1/2006 | Min | G11C 11/1659 438/257 |
| 2006/0077707 | A1 * | 4/2006 | Deak | G11C 11/16 365/171 |
| 2007/0077664 | A1 * | 4/2007 | Chung | G01K 7/36 438/2 |
| 2007/0229067 | A1 * | 10/2007 | Sasaki | B82Y 10/00 324/252 |
| 2008/0225577 | A1 * | 9/2008 | Hosotani | B82Y 10/00 365/158 |
| 2009/0097303 | A1 * | 4/2009 | Katti | G11C 11/1673 365/158 |
| 2011/0007561 | A1 * | 1/2011 | Berger | G11C 11/16 365/171 |
| 2011/0026377 | A1 * | 2/2011 | Shimazawa | G11B 5/314 369/13.24 |
| 2011/0122737 | A1 * | 5/2011 | Shimazawa | G11B 5/314 369/13.24 |
| 2011/0188297 | A1 * | 8/2011 | Ogimoto | B82Y 25/00 365/158 |
| 2012/0134246 | A1 * | 5/2012 | Shimazawa | G11B 5/02 369/13.26 |
| 2012/0230089 | A1 * | 9/2012 | Yamada | G11C 11/16 365/158 |
| 2013/0094284 | A1 * | 4/2013 | Ohno | H01L 43/08 365/158 |
| 2015/0001601 | A1 * | 1/2015 | Koike | H01L 43/02 257/295 |
| 2015/0137288 | A1 * | 5/2015 | Ohmori | G11C 11/161 257/421 |
| 2016/0233416 | A1 * | 8/2016 | Ikeda | H01L 43/08 |
| 2017/0229163 | A1 * | 8/2017 | Sasaki | G11C 11/161 |

FOREIGN PATENT DOCUMENTS

| | | | | |
|---|---|---|---|---|
| JP | 2004-326951 A | 11/2004 | | |
| JP | 2005-322352 A | 11/2005 | | |
| WO | WO 0124289 A1 * | 4/2001 | | G11C 11/15 |

OTHER PUBLICATIONS

Weller et al., Thermal Effect Limits in Ultrahigh-Density Magnetic Recording, IEEE Transactions on Magnetics, vol. 35, No. 6, pp. 4423-4439, 1999.

Chaves-O'Flynn et al., "Thermal Stability of Magnetic States in Circular Thin-Film Nanomagnets with Large Perpindicular Magnetic Anisotropy", Physical Review Applied 4, pp. 024010-1-024010-6, 2015.

Ando et al., "Spin-RAM for Normally-Off Computer", IEEE, 2011.

Kishi et al., "Lower-Current and Fast Switching of a Perpindicular TMR for High Speed and High Density Spin-Transfer-Torque MRAM", IEEE, 2008.

\* cited by examiner

APPARATUS AND METHOD FOR CONTROLLING WRITE CURRENT OF MAGNETIC MEMORY BASED ON TEMPERATURE DEPENDENT COERCIVE FORCE

BACKGROUND OF THE INVENTION

Field of the Invention

The present invention relates to a magnetic memory.

Priority is claimed on Japanese Patent Application No. 2016-020598, filed on Feb. 5, 2016, the content of which is incorporated herein by reference.

Description of Related Art

Gigantic magnetoresistance (GMR) elements formed of a multilayer film consisting of a ferromagnetic layer and a non-magnetic layer, and tunnel magnetoresistance (TMR) elements using an insulating layer (a tunnel barrier layer or a barrier layer) as a non-magnetic layer have been known. In general, TMR elements have higher element resistance than GMR elements, but a magnetoresistance (MR) ratio of the TMR elements is higher than that of the GMR elements. Therefore, TMR elements have attracted attention as an element for a magnetic sensor, a high-frequency component, a magnetic head, or a magnetoresistive random access memory (MRAM).

In an MRAM, data is written using the following properties: in a case where magnetization directions of two ferromagnetic layers between which an insulating layer is interposed change, an element resistance of TMR elements changes. As a write method for an MRAM, methods such as writing data (magnetization reversal) using a magnetic field generated by current, and writing data (magnetization reversal) using spin-transfer torque (STT) generated by current flowing in a laminating direction of magnetoresistance elements are known.

Incidentally, it is known that the coercive force of a ferromagnetic layer depends on the temperature of the ferromagnetic layer. As the temperature of a ferromagnetic layer increases, the coercive force of a ferromagnetic body decreases. Therefore, a general MRAM is designed such that data can be written (magnetization reversal) even at a low temperature at which the coercive force is high, and such that data can be held (no magnetization reversal) even at a high temperature at which the coercive force is low.

Typically, the guarantee temperature of a commercially available product is set to be wider than an assumed temperature at which the product is assumed to be used. Therefore, in an MRAM which is designed and prepared as described above, the write efficiency during actual use may be insufficient. Therefore, in order to compensate for a change in coercive force depending on a temperature change, Japanese Unexamined Patent Application, First Publication No. 2004-95157, Japanese Unexamined Patent Application, First Publication No. 2004-326951, and Japanese Unexamined Patent Application, First Publication No. 2005-322352 disclose memory elements in which the temperature of a magnetoresistance element is measured using a temperature sensor to change the amount of an applied current depending on the temperature.

SUMMARY OF THE INVENTION

In the memory elements disclosed in Japanese Unexamined Patent Application, First Publication No. 2004-95157, Japanese Unexamined Patent Application, First Publication No. 2004-326951, and Japanese Unexamined Patent Application, First Publication No. 2005-322352, the temperature is measured using an element or a circuit which is provided separately from the magnetoresistance elements. In a case where an element or a circuit is separately provided in order to measure the temperature as described above, the structure of a memory element becomes complicated, and the integration of the memory element may deteriorate.

The present invention has been made in consideration of the above-described problems, and an object thereof is to provide a highly integrated magnetic memory capable of compensating for a temperature change.

The present inventors found that, by laminating a conductive portion on a magnetoresistance element, a temperature change of the magnetoresistance element can be determined based on a change in the resistance value of the conductive portion and can be accurately measured without providing a separate element. In addition, it was also found that, by controlling current applied to a magnetoresistance element depending on predetermined conditions, a temperature change can be compensated more efficiently.

That is, in order to solve the above-described problems, the present invention provides the following means.

A magnetic memory according to an aspect of the present invention includes: a magnetoresistance element; a conductive portion that is laminated on the magnetoresistance element; and a control portion configured to determine a driving temperature of the magnetoresistance element based on a change in a resistance value of the conductive portion and control the amount of current applied to the magnetoresistance element.

The conductive portion may include an insulating layer and a conductive layer, the insulating layer is provided on the magnetoresistance element, the conductive layer is provided on the insulating layer and is not electrically connected to the magnetoresistance element, the control portion may include a temperature determination portion and current source, the temperature determination portion is electrically connected to the conductive layer and is configured to measure a resistance value of the conductive portion and calculate a driving temperature of the magnetoresistance element based on the resistance value, and the current source is configured to apply a required current to the magnetoresistance element based on the driving temperature.

In a plan view, at least a portion of the conductive portion may have a linear shape, and the conductive portion may form a predetermined pattern in a predetermined region.

The magnetoresistance element may have a recessed portion, and the conductive portion may be provided in the recessed portion.

During a temperature increase of the magnetoresistance element, the control portion may be configured to change the amount of an applied current depending on temperature ranges including a temperature-increase-low-temperature range of 0° C. or lower, a temperature-increase-room-temperature range of 0° C. to 75° C., and a temperature-increase-high-temperature range of 75° C. or higher.

During a temperature decrease of the magnetoresistance element, the control portion may be configured to change the amount of an applied current depending on temperature ranges including a temperature-decrease-low-temperature range of −10° C. or lower, a temperature-decrease-room-temperature range of −10° C. to 65° C., and a temperature-decrease-high-temperature range of 65° C. or higher.

The control portion may be configured to output the amount of an applied current depending on the temperature ranges based on a self-consistently renormalized spin fluctuation theory (SCR theory). The SCR theory is a theory which is obtained based on experience. The details of the SCR theory can be found in, for example. "Solid-state sciences library, Magnetism of Compounds—Itineront Electron System—, published by Shokabo Co., Ltd." (p 218 to 219, Kengo ADACHI). The amount of current required to reverse the magnetization is proportional to saturation magnetization. In addition, according to the SCR theory, in a temperature range of the Curie temperature (Tc) or lower, saturation magnetization (Ms) is proportional to the 3/2 power of a temperature T. Therefore, the amount of current required to perform magnetization reversal for each of the temperature ranges can be obtained based on a value of saturation magnetization depending on the temperature ranges.

The control portion may be configured to output the amount of an applied current depending on the temperature ranges based on a theory of thermal agitation.

In the magnetic memory according to the above-described aspects, a temperature change can be compensated more efficiently without providing a separate element for measuring a temperature.

DETAILED DESCRIPTION OF THE INVENTION

Figure 1:
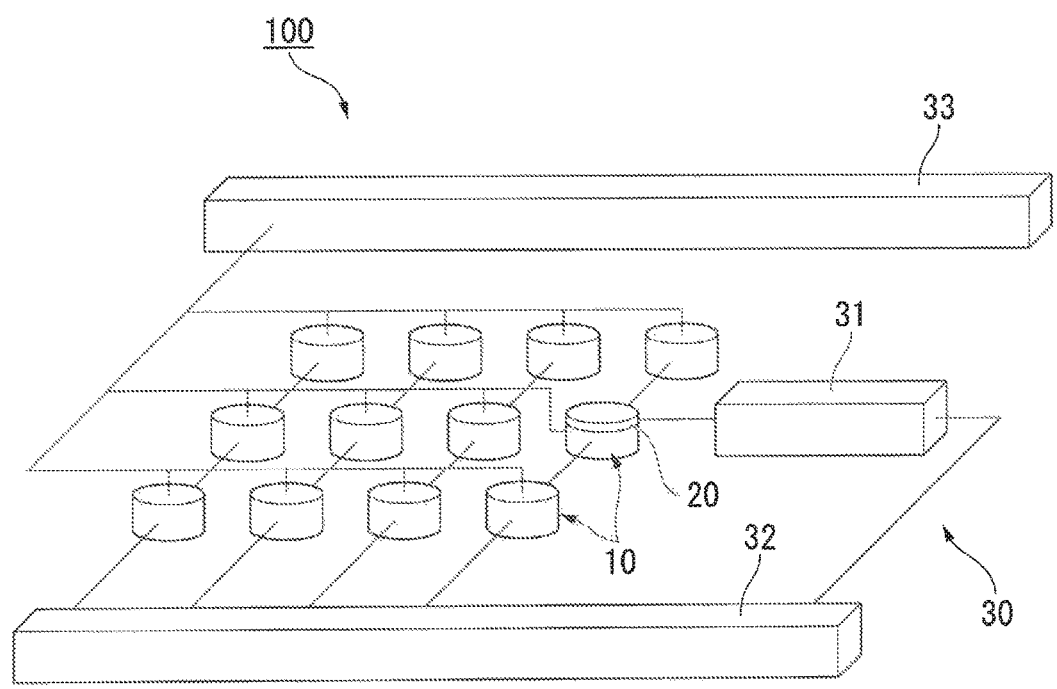
FIG. 1 is a diagram schematically showing a magnetic memory according to a first embodiment of the present invention.

Hereinafter, embodiments of the present invention will be described in detail while appropriately referring to the drawings. In the drawings used in the following description, in order to make the characteristics of the present invention easily understood, distinctive portions may be enlarged and shown for convenience, and a dimensional ratio between components and the like may be different from actual ones. In the following description, materials, dimensions, and the like are merely exemplary, and the present invention is not limited thereto. Within a range where the scope of the present invention does not change, materials, dimensions, and the like can be appropriately changed.

First Embodiment

Figure 2:
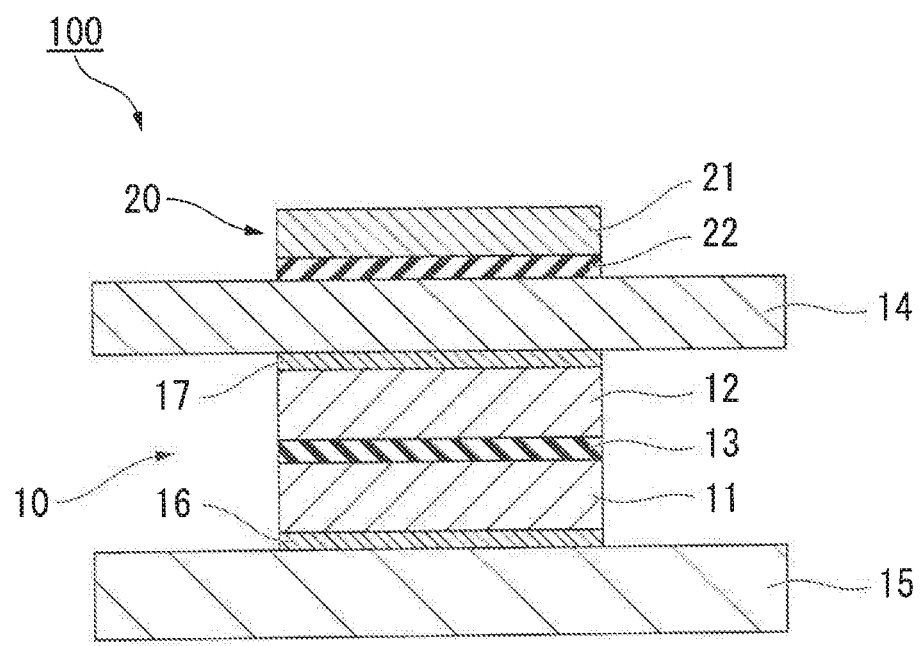
FIG. 2 is an enlarged view showing major components of the magnetic memory according to the first embodiment of the present invention.

FIG. 1 is a diagram schematically showing a magnetic memory according to a first embodiment of the present invention. In addition, FIG. 2 is an enlarged view schematically showing a cross-section of major components of the magnetic memory according to the first embodiment of the present invention. A magnetic memory 100 according to the first embodiment of the present invention includes a magnetoresistance element 10, a conductive portion 20, and a control portion 30. The magnetic memory 100 is turned on a substrate 15, In addition to the magnetic memory 100, other circuits such as a central processing unit (CPU) including a driver which outputs data, a receiver to which data is input, and an amplifier which amplifies data are formed on the substrate 15 at the same time.

[Magnetoresistance Element]

As shown in FIG. 2, the magnetoresistance element 10 includes a first ferromagnetic metal layer 11, a second ferromagnetic metal layer 12, and a non-magnetic layer 13. A wiring 14 is connected to the first ferromagnetic metal layer 11 and the second ferromagnetic metal layer 12. FIG. 2 is a cross-sectional view passing through the center of the magnetoresistance element 10 and taken along a direction extending to a wiring connected to the second ferromagnetic metal layer 12, in which a wring connected to the first ferromagnetic metal layer 11 is not shown.

In addition, other layers may be further provided within a range where the effects of the magnetoresistance element 10 can be realized.

For example, an undercoat layer 16 may be provided between the substrate 15 and the first ferromagnetic metal layer 11. In addition, for example, a cap layer 17 may be provided on a surface of the second ferromagnetic metal layer 12 which is opposite to a surface in contact with the non-magnetic layer 13 (between the second ferromagnetic metal layer 12 and the wiring 14 in FIG. 2). The undercoat layer 16 and the cap layer 17 are not necessarily provided.

(First Ferromagnetic Metal Layer and Second Ferromagnetic Metal Layer)

The first ferromagnetic metal layer 11 has a higher coercive force than the second ferromagnetic metal layer 12. That is, the magnetoresistance element 10 functions by fixing the magnetization of the first ferromagnetic metal layer 11 to one direction and relatively changing the magnetization direction of the second ferromagnetic metal layer 12. The first ferromagnetic metal layer 11 is called a pinned layer or a reference layer, and the second ferromagnetic metal layer 12 is called a free layer or a recording layer.

As a material of the first ferromagnetic metal layer 11, for example, a well-known material can be used. For example, a metal selected from the group consisting of Cr, Mn, Co, Fe, and Ni, or a ferromagnetic alloy including one or more of the above-described metals can be used. In addition, an alloy including the above-described metals and at least one element of B, C, or N can also be used. Specific examples of the alloy include Co—Fe and Co—Fe—B.

In addition, in order to obtain a higher power, it is preferable that a Heusler alloy such as $Co_2FeSi$ be used. The Heusler alloy includes an intermetallic compound having a chemical composition of $X_2YZ$. X represents a Co-, Fe-, Ni-, or Cu-group transition metal element or noble metal element in the periodic table. Y represents a Mn-, V-, Cr-, or Ti-group transition metal element and can also represent an element represented by X. Z represents a typical element in Groups III to V of the periodic table. Examples of the Heusler alloy include $Co_2FeSi$, $Co_2MnSi$, and $Co_2Mn_{1-a}Fe_aAl_bSi_{1-b}$.

In addition, in order to control the coercive force of the first ferromagnetic metal layer 11 to be higher than that of the second ferromagnetic metal layer 12, an antiferromagnetic material such as IrMn or PtMn nay be used as a material in contact with the first ferromagnetic metal layer 11. Furthermore, in order to prevent a leakage magnetic field of the first ferromagnetic metal layer 11 from affecting the second ferromagnetic metal layer 12, the first ferromagnetic metal layer 11 may have a synthetic ferromagnetic coupling structure.

In a case where the magnetization direction of the first ferromagnetic metal layer 11 is perpendicular to a laminating surface, it is preferable that a laminated film of Co and Pt be used. In a case where the magnetization direction is perpendicular to a laminating surface, the thermal stability of the magnetization can be improved. Specifically, the first ferromagnetic metal layer 11 can have a configuration of [Co (0.24 nm)/Pt (0.16 nm)]$_6$/Ru (0.9 nm)/[Pt (0.16 nm)/Co (0.16 nm)]$_4$/Ta (0.2 nm)/FeB (1.0 nm).

As a material of the second ferromagnetic metal layer 12, a ferromagnetic material, in particular, a soft magnetic material can be used. For example, a metal selected from the group consisting of Cr, Mn, Co, Fe, and Ni, an alloy including one or more of the above-described metals, or an alloy including the above-described metals and at least one element of B, C, or N can be used. Specific examples of the alloy include Co—Fe, Co—Fe—B, and Ni—Fe.

In addition, in a case where the magnetization direction of the second ferromagnetic metal layer 12 is perpendicular to a laminating surface, it is preferable that the thickness of the second ferromagnetic metal layer 12 be 2.5 nm or less. At an interface between the second ferromagnetic metal layer 12 and the non-magnetic layer 13, perpendicular magnetic anisotropy can be imparted to the second ferromagnetic metal layer 12. In addition, the effect of perpendicular magnetic anisotropy may be attenuated by increasing the thickness of the second ferromagnetic metal layer 12. Therefore, it is preferable that the thickness of the second ferromagnetic metal layer 12 be as thin as possible.

In order to utilize the magnetoresistance element agnetic sensor, it is as a preferable that a change in the resistance depending on an external magnetic field is linear. In a laminated film of a general ferromagnetic layer, a magnetization direction is likely to face the inside of a laminating surface due to shape anisotropy. In a case where the magnetization directions of the first ferromagnetic metal layer 11 and the second ferromagnetic metal layer 12 face the inside of a laminating direction, for example, a magnetic field is applied from the outside such that the magnetization direction of the first ferromagnetic metal layer is perpendicular to that of the second ferromagnetic metal layer. As a result, a change in the resistance depending on the external magnetic field is linear.

In this case, however, a mechanism for applying a magnetic field to the vicinity of the magnetoresistance element is necessary, which is not preferable from the viewpoint of integration and energy saving. Therefore, it is preferable that any one of the ferromagnetic metal layers has perpendicular magnetic anisotropy.

(Non-Magnetic Layer)

As a material of the non-magnetic layer 13, for example, a well-known material can be used.

For example, in a case where the non-magnetic layer 13 is an insulating body (is a tunnel barrier layer), as a material of the non-magnetic layer 13, for example. Al$_2$O$_3$, SiO$_2$, or MgO can be used. In addition to the above-described materials, for example, a material in which a portion of Al, Si, or Mg is substituted with Zn or Be can also be used. Among these materials, MgO is a material capable of realizing coherent tunneling, and thus spin can be injected efficiently.

In addition, in a case where the non-magnetic layer 13 is formed of a metal, as a material of the non-magnetic layer 13, for example, Cu, Au, or Ag can be used.

(Other Layers)

It is preferable that the cap layer 17 be formed on a surface of the second ferromagnetic metal layer 12 which is opposite to the non-magnetic layer 13 (between the second ferromagnetic metal layer 12 and the wiring 14 in FIG. 2). The cap layer 17 can control diffusion of elements from the second ferromagnetic metal layer 12. In addition, the cap layer 17 also contributes to the crystal orientation of each of the layers of the magnetoresistance element 10.

By providing the cap layer 17, magnetic properties of the first ferromagnetic metal layer 11 and the second ferromagnetic metal layer 12 in the magnetoresistance element 10 are stabilized, and the resistance of the magnetoresistance element 10 can be reduced. As a material of the cap layer 17, a heavy element such as Ru, Ta, Rh, or Ir, or an oxygen-deficient oxide obtained from an oxide represented by a compositional formula such as Al$_2$O$_3$, MgO, TaO$_x$, or HfO$_x$ is preferable.

It is preferable that the undercoat layer 16 be formed between the first ferromagnetic metal layer 11 and the substrate 15.

The undercoat layer 16 can control the crystallinity such as crystal orientation or crystal grain size of each of the layers including the first ferromagnetic metal layer 11 laminated on the substrate 15.

The undercoat layer 16 may be conductive or insulating. In a case where it is desired to apply current to the undercoat layer 16, it is preferable that the undercoat layer 16 is formed of a conductive material.

In one example, as the undercoat layer 16, a nitride layer, which has a NaCl structure oriented to (001) and includes at least one element selected from the group consisting of Ti, Zr, Nb, V, Hf, Ta, Mo, W, B, Al, and Ce, can be used.

In another example, as the undercoat layer 16, a perovskite conductive oxide layer represented by a compositional formula ABO$_3$ and oriented to (002) can be used. Here, the site A includes at least one element selected from the group consisting of Sr, Ce, Dy, La, K, Ca, Na, Pb, and Ba, and the site B includes at least one element selected from the group consisting of Ti, V, Cr, Mn, Fe, Co, Ni, Ga, Nb, Mo, Ru, Ir, Ta, Ce, and Pb.

In still another example, as the undercoat layer 16, an oxide layer, which has a NaCl structure oriented to (001) and includes at least one element selected from the group consisting of Mg, Al, and Ce, can be used.

In still another example, as the undercoat layer 16, a layer, which has a tetragonal structure or a cubic structure oriented to (001) and includes at least one element selected from the group consisting of Al, Cr, Fe, Co, Rh, Pd, Ag, Ir, Pt, Au, Mo, and W, can be used.

In addition, the undercoat layer 16 is not limited to a single-layer structure and may be a laminate structure in which the plural layers of the above-described examples are laminated. By devising the configuration of the undercoat layer 16, the crystallinity of each of the layers of the magnetoresistance element 10 is improved, and magnetic properties can be improved.

(Substrate)

It is preferable that the substrate 15 has excellent flatness. In order to obtain a surface having excellent flatness, as a material of the substrate 15, for example, Si, SiGe, SiC, or AlTiC can be used. In addition, in a case where the magnetoresistance element 10 is used as an MRAM, a circuit including a plurality of layers is formed between the substrate 15 and the undercoat layer 16.

[Conductive Portion]

The conductive portion 20 includes a conductive layer 21 and an insulating layer 22 and is laminated on the magnetoresistance element 10. As shown in FIG. 2, the insulating layer 22 is laminated on the wiring 14, and the conductive layer 21 is laminated on the insulating layer 22. Therefore, the magnetoresistance element 10 and the conductive layer 21 are not electrically connected to each other.

The resistance value of the conductive portion 20 changes depending on a temperature change. Therefore, by measuring the resistance of the conductive portion 20, the temperature of the magnetoresistance element 10 can be measured.

It is preferable that, in a plan view, at least a portion of the conductive portion 20 have a linear shape extending in a direction where the current flows. By forming the conductive portion 20 in a linear shape, the distance in which the current flows through the inside of the conductive portion 20 can be increased, and the amount of a change in the resistance value depending on a temperature change can be increased. Therefore, a relationship between the resistance value and the temperature can be obtained more accurately.

In addition, it is preferable that the conductive portion 20 forms a predetermined pattern in a predetermined region R of the magnetoresistance element 10. As the predetermined pattern, various patterns can be adopted.

Figure 3A:
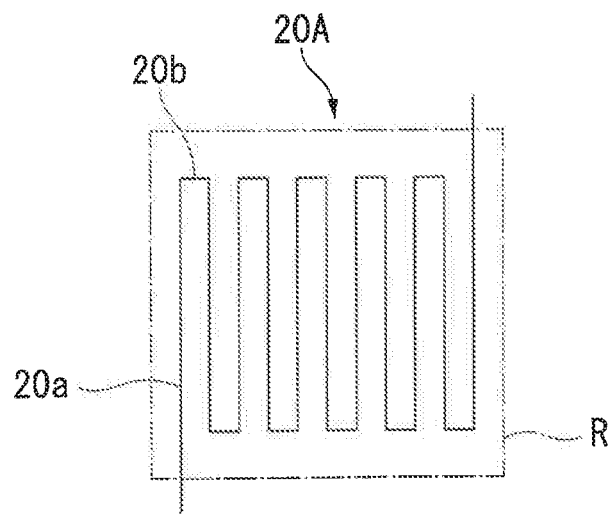
FIGS. 3A to 3C are plan views schematically showing a conductive portion of the magnetic memory according to the first embodiment of the present invention.
Figure 3B:
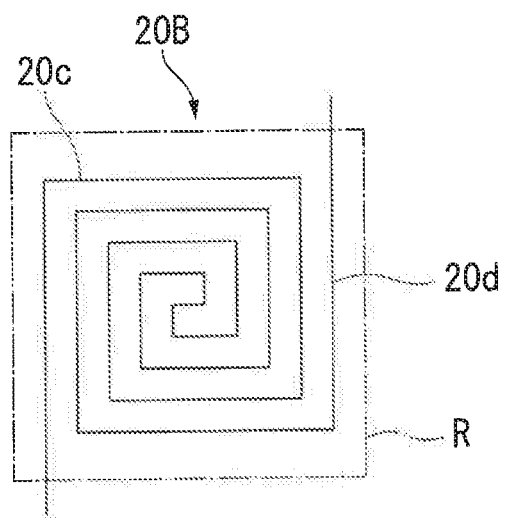
Figure 3C:
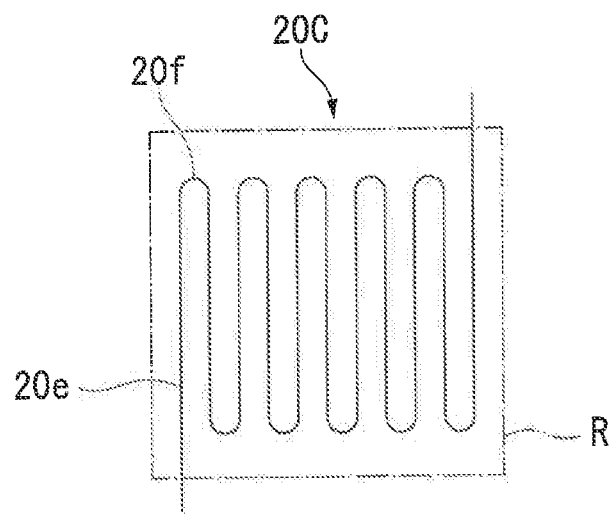

For example, as shown in FIG. 3A, the conductive portion 20 may be configured as a comb-shaped pattern 20A in which a first wiring 20a extending in one direction and a second wiring 20b intersecting with the first wiring 20a are alternately connected. In addition, as shown in FIG. 3B, the conductive portion 20 may be configured as a spiral pattern 2013 in which a first spiral wiring 20c whose diameter gradually decreases and a second spiral wiring 20d whose diameter gradually increases are connected. Furthermore, as shown in FIG. 3C, the conductive portion 20 may be configured as a meandering pattern 20C in which a first wiring 20e extending in one direction and a bent portion 20f are alternately connected. The predetermined pattern can be formed using a patterning technique such as photolithography.

By the conductive portion 20 forming the pattern in the predetermined region R, the length of the conductive portion 20 can be secured in the limited region, and the integration can be improved. In addition, the amount of a change in the resistance value depending on the temperature change can be increased, and thus the temperature change of the magnetoresistance element 10 can be measured more accurately.

In addition, it is preferable that the predetermined region R is the entire surface of positions which overlap the major components (the first ferromagnetic metal layer 11, the second ferromagnetic metal layer 12, and the non-magnetic layer 13) of the magnetoresistance element 10 in a plan view. That is, it is preferable that the conductive portion 20 be provided on the entire surface of positions which overlap the major components of the magnetoresistance element 10 in a plan view.

A place of the magnetoresistance element 10 where the magnetization reversal occurs is the second ferromagnetic metal layer 12. Therefore, by measuring the temperature of the second ferromagnetic metal layer 12 more accurately, the amount of current required to reverse the magnetization of the second ferromagnetic metal layer 12 can be obtained. In a case where the conductive portion 20 is provided on the entire surface of positions which overlap with the major components of the magnetoresistance element 10 in a plan view, the temperature of the entire in-plane surface of the second ferromagnetic metal layer 12 can be measured more accurately without omission.

A material used in the conductive layer 21 is not particularly limited but is preferably a material having a high temperature coefficient of resistivity. The temperature coefficient of resistivity represents the amount of a change in resistivity per temperature increase of 1° C. As a material of the conductive layer 21, for example, gold, silver, copper, aluminum, or iron can be used.

The insulating layer 22 prevents electrical connection between the magnetoresistance element 10 and the conductive layer 21. A material used in the insulating layer 22 is not particularly limited but is preferably a material having excellent thermal conductivity and insulating properties. Examples of the material having excellent thermal conductivity and insulating properties include AlN and SIC.

[Control Portion]

The control portion 30 includes a temperature determination portion 31 and current sources 32 and 33. The temperature determination portion 31 is electrically connected to the current source 32 and the conductive portion 20 (conductive layer 21). The temperature determination portion 31 determines a resistance value of the conductive portion 20 and determines (calculates) a driving temperature of the magnetoresistance element 10 based on the resistance value. A current amount calculating portion (not shown) calculates the amount of current applied to the magnetoresistance element 10 based on the temperature information. The current sources 32 and 33 apply current to the magnetoresistance element 10 in an amount which is required with respect to the calculated driving temperature. The current sources 32 and 33 may be divided into a current source for reading and a current source for writing as shown in FIG. 1. In addition, only the current source 32 may be configured to perform both reading and writing. As the temperature determination portion 31 and the current sources 32 and 33, a well-known device can be used. The procedure of determining a temperature and the procedure of outputting the amount of current corresponding to a temperature, which are performed by the control portion 30, will be described below.

As described above, in the magnetic memory according to the first embodiment of the present invention, the temperature of the magnetoresistance element can be measured without separately providing an element or a circuit, and the degree of integration of the magnetic memory can be improved.

Next, the driving of the magnetic memory 100 according to the embodiment will be described.

The magnetic memory 100 according to the embodiment includes: a procedure of determining a temperature range to which the temperature of the magnetoresistance element 10 corresponds among preset temperature ranges; and a procedure of changing the amount of an output current depending on the temperature range. The magnetic memory 100 can record data by being driven according to the above procedures.

[Procedure of Determining Temperature]

In the magnetic memory 100, first, the temperature determination portion 31 determines a temperature range to which the temperature of the magnetoresistance element 10 corresponds among preset temperature ranges. Specifically, current is caused to flow through the conductive portion 20 to measure a resistance value of the conductive portion 20. A temperature range to which the temperature of the magnetoresistance element 10 corresponds is determined among preset temperature ranges based on a relationship between the temperature of the conductive portion 20 and the resistance value thereof which has been created in advance.

In the embodiment, three temperature ranges are set during a temperature increase or a temperature decrease of the magnetoresistance element 10. By setting a temperature range among the three roughly divided temperature ranges, the load on the temperature determination portion 31 can be reduced. In a case where the load on the temperature determination portion 31 increases, the operation of the temperature determination portion 31 is delayed or the configuration of the temperature determination portion 31 is complexed, which may cause deterioration in integration.

In a case where the relationship between the temperature of the conductive portion 20 and the resistance value thereof is corrected in advance, the temperature ranges can be divided more specifically, or a specific temperature corresponding to the correction can be detected.

The temperature ranges during a temperature increase of the magnetoresistance element 10 are three temperature ranges including a temperature-increase-low-temperature range of 0° C. or lower, a temperature-increase-room-temperature range of 0° C. to 75° C., and a temperature-increase-high-temperature range of 75° C. or higher.

A boundary between the temperature-increase-low-temperature range and the temperature-increase-room-temperature range is set as 0° C. 0° C. is the melting point of water, and in a case where the temperature of the magnetoresistance element 10 is lower than 0° C., moisture and the like in the air around the magnetoresistance element freeze and condense on the surface of the magnetoresistance element 10, which may cause a significant change in the driving environment of the magnetoresistance element 10. By setting the boundary as 0° C., even a case where the magnetoresistance element 10 exhibits different behaviors can be handled based on a change in the driving environment of the magnetoresistance element 10.

In addition, a boundary between the temperature-increase-room-temperature range and the temperature-increase-high-temperature range is set as 75° C. 75° C. is close to a temperature of a region near a dashboard of a vehicle in the summer. That is, 75° C. is the maximum temperature in an environmental temperature (air temperature) range in which it is assumed that a person typically uses the magnetoresistance element 10. Therefore, by setting the boundary as 75° C., in a case where the magnetic memory 100 is used in a typical environment, it is avoidable to frequently change the setting of an applied current value, and the magnetic memory can be operated more efficiently.

In a case where it is assumed that heat dissipation deteriorates, for example, an environment where the magnetoresistance element 10 is provided is sealed, the boundary may be set as 85° C. That is, the temperature-increase-room-temperature range may be set as 0° C. to 85° C., and the temperature-increase-high-temperature range may be set as 85° C. or higher.

On the other hand, the temperature ranges during a temperature decrease of the magnetoresistance element 10 are three temperature ranges including a temperature-decrease-low-temperature range of −10° C. or lower, a temperature-decrease-room-temperature range of −10° C. to 65° C., and a temperature-decrease-high-temperature range of 65° C. or higher. These temperature ranges are set to be lower than those during the temperature increase by 10° C., respectively.

By shifting the boundaries between the temperature ranges during the temperature increase from the boundaries between the temperature ranges during the temperature decrease, it is avoidable to frequently change the setting of an applied current value at a boundary temperature.

For example, during the operation of the magnetic memory 100, the temperature of the magnetoresistance element 10 is not increased uniformly but is increased while repeatedly increased and decreased in a given temperature width. By shifting the boundaries between the temperature ranges during the temperature increase from those during the temperature decrease, an effect of the temperature increase and the temperature decrease in the temperature width can be ignored.

The resistance value of the conductive portion 20 may be measured as needed or at regular intervals. In a case where the operation of the magnetic memory 100 is in a normal state, the temperature change rarely occurs. Therefore, it is preferable that the resistance value of the conductive portion 20 be measured at regular intervals from the viewpoint of avoiding the delay of the operation of the temperature determination portion 31 or an excessive load on the temperature determination portion 31. In addition, during the start and end of the operation of the magnetic memory 100, it is assumed that the temperature change frequently occurs. Therefore, the measurement intervals may be reduced at the timing when the temperature change frequently occurs.

[Procedure of Determining Amount of Output Current]

Next, the temperature determination portion 31 indicates the amount of an output current corresponding to the temperature range, which is determined based on the resistance value, to the current source 32. The amount of current applied to the magnetoresistance element 10 is set based on a predetermined theory for each of the temperature ranges. As the predetermined theory, either a SCR theory or a theory of thermal agitation may be used.

The SCR theory is a theory which is obtained based on experience. The details of the SCR theory can be found in, for example, "Solid-state sciences library, Magnetism of Compounds—Itineront Electron System—, published by Shokabo Co., Ltd." (p. 218 to 219, Kengo ADACHI).

In addition, the theory of thermal agitation is a theory in which the probability of magnetization reversal is stochastically obtained from a barrier (storage barrier) between thermal energy and energy required for magnetization reversal. The details can be found in, for example, "IEEE TRANSACTIONS ON MAGNETICS, vol. 35, No. 6, 1999, p. 4423".

First, a case where the amount of current is set based on the SCR theory will be described.

The amount of current required to reverse the magnetization of the second ferromagnetic metal layer 12 is proportional to saturation magnetization. In addition, according to the SCR theory, in a temperature range of the Curie temperature (Tc) or lower, saturation magnetization (Ms) is proportional to the 3/2 power of a temperature T. Therefore, the amount of current required to perform magnetization reversal for each of the temperature ranges can be obtained based on a value of saturation magnetization depending on the temperature ranges.

Based on the SCR theory, it is preferable that the amount of current applied in the temperature-increase-low-temperature range and the temperature-decrease-low-temperature range be more than 1.03 times the amount of current applied in the temperature-increase-room-temperature range and the temperature-decrease-room-temperature range. In addition, it is preferable that the amount of current applied in the temperature-increase-high-temperature range and the temperature-decrease-high-temperature range be more than 0.98 times and less than 1 time the amount of current applied in the temperature-increase-room-temperature range and the temperature-decrease-room-temperature range.

As described above, the SCR theory is established in a temperature range of the Curie temperature (Tc) or lower. Therefore, in a case where the operating temperature of the magnetic memory 100 is sufficiently lower than the Curie temperature of the second ferromagnetic metal layer 12 (for example, is a temperature which is ⅓ or less of the Curie temperature of the second ferromagnetic metal layer 12), it is preferable that the amount of current be set based on the SCR theory. The Curie temperature of Co is 1388 K, and the Curie temperature of Ni is 627 K. Therefore, the operating temperature of the magnetic memory 100 is sufficiently lower than the Curie temperature of the second ferromagnetic metal layer 12.

Next, a case where the amount of current is set based on the theory of thermal agitation will be described.

In order to stably hold data in the magnetic memory 100 for 10 years, it is known that the proportion of magnetization reversal is required to be $10^{-15}$ or lower. In order to realize this proportion, it is known that the storage barrier is required to be 60 $k_BT$ ($k_B$ represents a Boltzmann's constant, and T represents an absolute temperature) or higher.

That is, in a case where a predetermined current value is applied in a predetermined temperature environment, the proportion that magnetization reversal occurs by the storage barrier exceeding 60 $k_BT$ is obtained based on the theory of thermal agitation. In a case where this proportion is a predetermined value or higher, it can be determined that magnetization reversal occurs stably. Therefore, the amount of current required in a predetermined temperature range can be obtained based on the probability calculation. According to this calculation, the amount of an applied current is proportional to the inverse of the temperature.

Based on the theory of thermal agitation, it is preferable that the amount of current applied in the temperature-increase-low-temperature range and the temperature-decrease-low-temperature range is more than 1.27 times the amount of current applied in the temperature-increase-room-temperature range and the temperature-decrease-room-temperature range. In addition, it is preferable that the amount of current applied in the temperature-increase-high-temperature range and the temperature-decrease-high-temperature range be more than 0.83 times and less than 1 time the amount of current applied in the temperature-increase-room-temperature range and the temperature-decrease-room-temperature range.

As described above, according to the theory of thermal agitation, the amount of an applied current is proportional to the inverse of the temperature. Being proportional to the inverse of the temperature represents that the current is diffused at an extremely low temperature. Therefore, it is preferable that the theory of thermal agitation is not used at an extremely low temperature.

In a case where the magnetic memory is driven according to the above-described procedures, the control portion 30 reads the temperature of the magnetoresistance element 10 from the resistance value of the conductive portion 20 and can calculate a required amount of current from the temperature.

Therefore, the lower limit value of a write current and the upper limit value of a read current can be set depending on the temperature ranges, and data can be recorded more efficiently.

Second Embodiment

Figure 4:
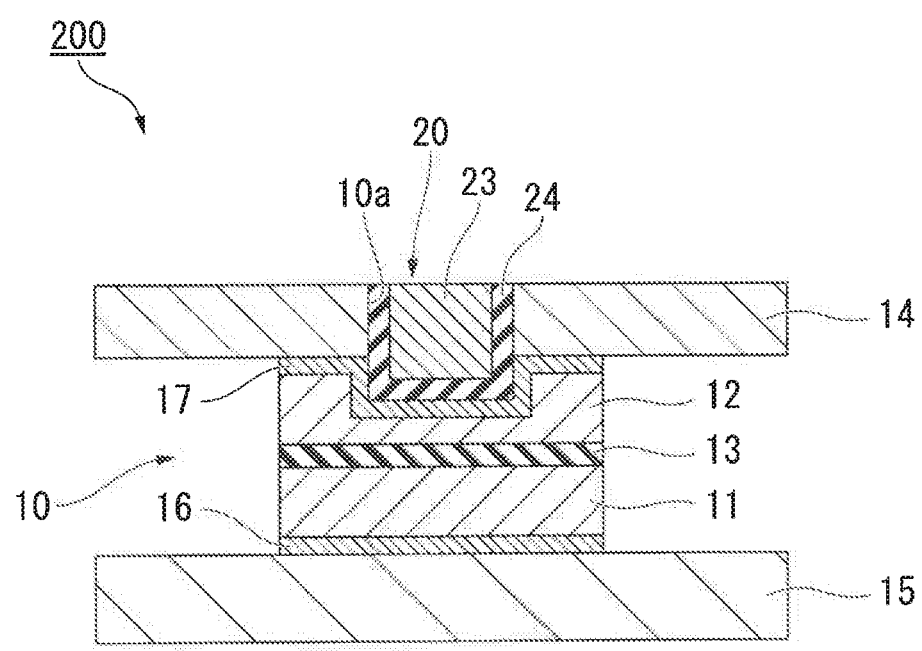
FIG. 4 is an enlarged view showing major components of a magnetic memory according to a second embodiment of the present invention.

Next, a magnetic memory according to a second embodiment will be described with reference to FIG. 4. FIG. 4 is an enlarged view showing major components of the magnetic memory according to the second embodiment.

In the second embodiment, the same components as in the first embodiment are represented by the same reference numerals, and the detailed description thereof will not be repeated. The magnetic memory 200 according to the second embodiment is different from that of the first embodiment, in that the conductive portion 20 is embedded in a recessed portion provided in the magnetoresistance element 10.

In the magnetic memory 200 according to the second embodiment, the recessed portion 10a is formed in the magnetoresistance element 10. The recessed portion 10a is formed on a surface of the magnetoresistance element 10 which is opposite to the substrate 15 (a surface of the second ferromagnetic metal layer 12 which is opposite to the non-magnetic layer 13). In the recessed portion 10a, a conductive layer 23 is formed with an insulating layer 24 interposed therebetween. As shown in FIG. 4, the conductive portion 20 passes through the wiring 14, and an exposed surface thereof is formed to match with the top surface of the wiring 14 (a surface thereof opposite to the second ferromagnetic metal layer 12). The insulating layer 24 is provided at an boundary between the second ferromagnetic metal layer 12 and the conductive layer 23 and at an boundary between the wiring 14 and the conductive layer 23 and prevents electrical connection between the magnetoresistance element 10 and the conductive layer 23.

As in the case of the conductive portion according to the first embodiment, it is preferable that, in a plan view, the conductive layer 23 be disposed in a predetermined pattern in a predetermined region.

According to the above-described configuration, the conductive portion 20 can be provided without protruding from the magnetoresistance element 10 (wiring 14). Therefore, the elements can be integrated on a circuit board not only three-dimensionally but also two-dimensionally.

Hereinabove, the embodiments of the present invention have been described with reference to the drawings. However, the respective configurations in the embodiments and combinations thereof are merely exemplary, and additions, omissions, replacements, and other modifications of configurations can be made within a range not departing from the scope of the present invention.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. A magnetic memory comprising:
   a magnetoresistance element;
   a conductive portion that is laminated on the magnetoresistance element; and
   a control portion configured to determine a driving temperature of the magnetoresistance element based on a change in a resistance value of the conductive portion and control an amount of current applied to the magnetoresistance element,
   wherein the magnetoresistance element has a recessed portion, and the conductive portion is provided in the recessed portion,
   the conductive portion comprises an insulating layer and a conductive layer, the insulating layer is provided on the magnetoresistance element, the conductive layer is provided on the insulating layer and is not electrically connected to the magnetoresistance element, in a plan view, at least a portion of the conductive portion has a linear shape, and the conductive layer forms either one of the following pattern of (a), (b), or (c) in a predetermined region, (a) a comb-shaped pattern in which a first wiring extending in one direction and a second wiring intersecting with the first wiring are alternately connected, (b) a spiral pattern in which a first spiral wiring whose diameter gradually decreases and a second spiral wiring whose diameter gradually increases are connected, (c) a meandering pattern in which a first wiring extending in one direction and a bent portion are alternately connected, and the control portion comprises a temperature determination portion and a current source, the temperature determination portion is electrically connected to the conductive layer and is configured to measure a resistance value of the conductive portion and calculate a driving temperature of the magnetoresistance element based on the resistance value, the current source is configured to apply a required amount of current to the magnetoresistance element based on the driving temperature.

2. The magnetic memory according to claim 1, wherein during a temperature increase of the magnetoresistance element, the control portion is configured to change an amount of an applied current depending on temperature ranges including a temperature-increase-low-temperature range of 0° C. or lower, a temperature-increase-room-temperature range of 0° C. to 75° C., and a temperature-increase-high-temperature range of 75° C. or higher.

3. The magnetic memory according to claim 1, wherein during a temperature decrease of the magnetoresistance element, the control portion is configured to change an amount of an applied current depending on temperature ranges including a temperature-decrease-low-temperature range of −10° C. or lower, a temperature-decrease-room-temperature range of −10° C. to 65° C., and a temperature-decrease-high-temperature range of 65° C. or higher.

4. The magnetic memory according to claim 1, wherein the control portion is configured to output an amount of an applied current depending on the temperature ranges based on the fact in which an amount of a current required to reverse magnetization is proportional to saturation magnetization and a self-consistently renormalized spin fluctuation theory (SCR theory) in which the saturation magnetization is proportional to the 3/2 power of a temperature in a temperature range of the Curie temperature or lower.

5. The magnetic memory according to claim 1, wherein the control portion is configured to output an amount of an applied current depending on the temperature ranges based on a theory of thermal agitation in which the amount of an applied current is proportional to the inverse of the temperature under a predetermined condition.

6. The magnetic memory according to claim 1, wherein the conductive portion consists of the insulating layer and the conductive layer, and the conductive layer consists of either one of gold, silver, copper, aluminum, or iron.

7. A magnetic memory comprising:

a magnetoresistance element;

a conductive portion that is laminated on the magnetoresistance element; and a control portion configured to determine a driving temperature of the magnetoresistance element based on a change in a resistance value of the conductive portion and control an amount of current applied to the magnetoresistance element, wherein the magnetoresistance element includes a first ferromagnetic metal layer, a non-magnetic layer provided on the first ferromagnetic metal layer, and a second ferromagnetic metal layer provided on the non-magnetic layer, an upper surface of the second ferromagnetic metal layer has a recessed portion, and the conductive portion is provided in the recessed portion, the conductive portion comprises an insulating layer and a conductive layer, the insulating layer is provided on the magnetoresistance element, the conductive layer is provided on the insulating layer and is not electrically connected to the magnetoresistance element, in a plan view, at least a portion of the conductive portion has a linear shape, and the conductive layer forms either one of the following pattern of (a), (b), or (c) in a predetermined region, (a) a comb-shaped pattern in which a first wiring extending in one direction and a second wiring intersecting with the first wiring are alternately connected, (b) a spiral pattern in which a first spiral wiring whose diameter gradually decreases and a second spiral wiring whose diameter gradually increases are connected, (c) a meandering pattern in which a first wiring extending in one direction and a bent portion are alternately connected, and the control portion comprises a temperature determination portion and a current source, the temperature determination portion is electrically connected to the conductive layer and is configured to measure a resistance value of the conductive portion and calculate a driving temperature of the magnetoresistance element based on the resistance value, the current source is configured to apply a required amount of current to the magnetoresistance element based on the driving temperature.

* * * * *